(12) United States Patent
Wada

(10) Patent No.: US 9,565,750 B2
(45) Date of Patent: Feb. 7, 2017

(54) WIRING BOARD FOR MOUNTING A SEMICONDUCTOR ELEMENT

(71) Applicant: KYOCERA SLC Technologies Corporation, Yasu-shi, Shiga (JP)

(72) Inventor: Hisayoshi Wada, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 628 days.

(21) Appl. No.: 13/968,780

(22) Filed: Aug. 16, 2013

(65) Prior Publication Data

US 2014/0048323 A1    Feb. 20, 2014

(30) Foreign Application Priority Data

Aug. 18, 2012  (JP) ................................ 2012-181252
Aug. 18, 2012  (JP) ................................ 2012-181253

(51) Int. Cl.
    *H05K 1/11*      (2006.01)
    *H05K 1/02*      (2006.01)
    (Continued)

(52) U.S. Cl.
    CPC ....... *H05K 1/0243* (2013.01); *H01L 23/49822* (2013.01); *H01L 23/49827* (2013.01);
    (Continued)

(58) Field of Classification Search
    CPC .. H05K 1/0243; H05K 1/0245; H05K 1/0253; H05K 3/4602; H05K 1/0225; H01L 23/49822
    (Continued)

(56) References Cited

U.S. PATENT DOCUMENTS 6,787,710 B2    9/2004   Uematsu et al.
2006/0164179 A1 7/2006   Arai et al.
(Continued)

FOREIGN PATENT DOCUMENTS

| JP | 2002-353588 A | 12/2002 |
|----|---------------|---------|
| JP | 2006-211070 A | 8/2006  |
| JP | 2010-258390 A | 11/2010 |
| JP | 2010-259390 A | 11/2010 |
| JP | 2012-033529 A | 2/2012  |

OTHER PUBLICATIONS

Office Action dated Nov. 24, 2015, issued in counterpart Japanese Application No. 2012-181252.
(Continued)

*Primary Examiner* — Tremesha S Willis
(74) *Attorney, Agent, or Firm* — Procopio Cory Hargreaves and Savitch LLP

(57) ABSTRACT

A wiring board including an insulating board formed such that an inner insulating layer is laminated under a front insulating layer, a pair of semiconductor element connection pads for a signal, formed on the front insulating layer, and a pair of strip-shaped wiring conductors formed on the inner insulating layer, having connection ends connected to the pair of pads for the signal under the pair of pads through via holes, and having parallel extending portions extending to an outer peripheral portion from the connection ends on the inner insulating layer in parallel to each other, where a part from the connection end to one part of the parallel extending portion has a width smaller than a width of a residual part, and length equal to or less than one-sixteenth of a wavelength of a signal transmitting in the pair of strip-shaped wiring conductors.

14 Claims, 13 Drawing Sheets

(51) Int. Cl.
*H01L 23/498* (2006.01)
*H05K 3/46* (2006.01)

(52) U.S. Cl.
CPC ..... *H01L 23/49894* (2013.01); *H05K 1/0245* (2013.01); *H05K 1/0253* (2013.01); *H01L 2224/16225* (2013.01); *H01L 2924/1531* (2013.01); *H05K 1/0225* (2013.01); *H05K 3/4602* (2013.01); *H05K 2201/093* (2013.01); *H05K 2201/0969* (2013.01); *H05K 2201/09727* (2013.01)

(58) Field of Classification Search
USPC ....... 174/262, 250, 251, 253, 255, 257, 258, 174/261, 267
See application file for complete search history.

(56) References Cited

U.S. PATENT DOCUMENTS

| | | | |
|---|---|---|---|
| 2011/0126221 A1* | 5/2011 | Kitayama | G11B 17/056 720/600 |
| 2011/0180942 A1* | 7/2011 | Oikawa | H01L 23/66 257/786 |

OTHER PUBLICATIONS

Office Action issued Feb. 9, 2016 by the Japanese Patent Office for corresponding Japanese patent application No. 2012-181253.

* cited by examiner

WIRING BOARD FOR MOUNTING A SEMICONDUCTOR ELEMENT

BACKGROUND OF THE INVENTION (1) Field of the Invention

The present invention relates to a wiring board for mounting a semiconductor element.

(2) Description of the Related Art

Conventionally, as a wiring board for mounting a semiconductor element, a wiring board having a multilayer structure formed by a buildup technique is used (Japanese Unexamined Patent Application Publication No. 2010-259390). A conventional example of this wiring board is shown in FIGS. 10 and 11. As shown in FIG. 10, a conventional wiring board 200 is formed such that a buildup portion 32 is laminated on each of upper and lower surfaces of a core board 31.

The core board 31 includes a core insulating plate 34 having a plurality of through holes 33, and a core wiring conductor 35 adhered to an inside of the through hole 33 and upper and lower surfaces of the core insulating plate 34. The core insulating plate 34 is formed of a fiber-reinforced resin plate provided by impregnating glass cloth with a thermosetting resin such as epoxy resin.

The buildup portion 32 is formed by alternately laminating a buildup insulating layer 37 having a plurality of via holes 36, and a buildup wiring conductor 38 adhered to an inside of the via hole 36 and a surface of the buildup insulating layer 37, on each of the upper and lower surfaces of the core board 31. The buildup insulating layer 37 is formed of a filler containing resin layer in which an inorganic insulating filler composed of silicon oxide is dispersed in a thermosetting resin such as epoxy resin.

A solder resist layer 39 is adhered to a surface of the buildup portion 32 laminated on each of the upper and lower surfaces of the core board 31, in order to protect the buildup wiring conductor 38 provided in each of the uppermost and lowermost layers. The solder resist layer 39 is made of thermosetting resin such as acrylic-modified epoxy resin.

A mounting portion 32A for mounting a semiconductor element 53 is provided in a center of an upper surface of the buildup portion 32 on an upper surface side. The mounting portion 32A is a rectangular region having a size corresponding to the semiconductor element 53. In general, each side of the mounting portion 32A is parallel to an outer peripheral side of the wiring board 200. A plurality of semiconductor element connection pads 40 each formed of the buildup wiring conductor 38 adhered onto an uppermost buildup insulating layer 37 on the upper surface side are formed in the mounting portion 32A. Several hundreds to several thousands of the semiconductor element connection pads 40 are arranged in a shape of a lattice.

A plurality of external connection pads 41 each formed of the buildup wiring conductor 38 adhered to a lower surface of a lowermost buildup insulating layer 37 on a lower layer side are formed on a lower surface of the buildup portion 32 on a lower surface side. Several hundreds to several thousands of the external connection pads 41 are arranged in a shape of a lattice. The semiconductor element connection pad 40 and the external connection pad 41 corresponding to each other are electrically connected through the buildup wiring conductor 38 and the core wiring conductor 35.

By the way, as for the current semiconductor element, high-speed and high-capacity transmission are remarkably increased. In tandem with it, a wiring board for mounting the semiconductor element is required to be configured such that an electric loss is low at the time of high-frequency transmission. Therefore, as for the wiring board having a transmission path to transmit a high frequency signal, the wiring board has differential lines as the transmission paths for the high frequency signal in many cases. The differential lines are provided such that two transmission lines are adjacently provided side by side with a predetermined distance provided between them. When the signals having opposite phases are transmitted in the transmission lines, the transmission loss can be reduced at the time of the high frequency transmission.

The differential lines will be described with reference to FIGS. 11 and 12. FIG. 11 is a top view of the wiring board 200 shown in FIG. 10, and mainly shows a couple of differential lines. Referring to FIG. 11, an outline of the wiring board 200 and the semiconductor element connection pads 40 are shown by solid lines, and a pair of wiring conductors 42P and 42P and a pair of external connection pads 41P and 41P for configuring the differential lines in an inside part and a lower surface of the wiring board 200 are shown by dotted lines. The semiconductor element mounting portion 32A is shown by two-dot chain line. FIG. 12 is a perspective view only showing the differential lines extracted from FIG. 11.

As shown in FIGS. 11 and 12, the semiconductor element connection pads 40 have a pair of connection pads 40P and 40P for the differential lines. The pair of semiconductor element connection pads 40P and 40P is adjacently arranged. The external connection pads 41 have the pair of external connection pads 41P and 41P corresponding to the pair of semiconductor element connection pads 40P and 40P, respectively. The pair of semiconductor element connection pads 40P and 40P is electrically connected to the pair of external connection pads 41P and 41P, through the pair of strip-shaped wiring conductors 42P and 42P provided in the buildup wiring conductor 38 on the upper surface side.

The pair of strip-shaped wiring conductors 42P and 42P extend from circular first lands 42B positioned below the corresponding pair of semiconductor element connection pads 40P and 40P, to circular second lands 42C positioned above the pair of external connection pads 41P and 41P. The pair of semiconductor element connection pads 40P and 40P is electrically connected to the first lands 42B in the pair of strip-shaped wiring conductors 42P and 42P through via holes 36 positioned just under the pair of semiconductor element connection pads 40P and 40P. The pair of external connection pads 41P and 41P is electrically connected to the second lands 42C in the pair of strip-shaped wiring conductors 42P and 42P through the through holes 33 and the plurality of via holes 36 provided above the pair of external connection pads 41P and 41P. The pair of strip-shaped wiring conductors 42P and 42P has parallel extending portions 42A which extend in parallel to each other, except for the vicinity of connection ends to the pair of semiconductor element connection pads 40P and 40P (the first lands 42B and connection portions 42D), and the vicinity of connection ends to the pair of external connection pads 41P and 41P (the second lands 42C and connection portions 42E). As for the parallel extending portion 42A, a width of the strip-shaped wiring conductor and a distance between the adjacent strip-shaped wiring conductors are adjusted so that a characteristic impedance of the pair of strip-shaped wiring conductors 42P and 42P shows 100Ω, for example.

FIG. 13 is a partial perspective view showing only an extracted part of the core wiring conductor 35 and the plurality of buildup wiring conductors 38 on the upper surface side.

A ground or power supply conductor G1 is arranged in the uppermost buildup wiring conductor 38 positioned on the upper surface side of the pair of strip-shaped wiring conductors 42P and 42P, so as to be opposed to a region of the same layer as the pair of strip-shaped wiring conductors 42P and 42P, except for the connection end to the pair of semiconductor element connection pads 40P and 40P, in the pair of strip-shaped wiring conductors 42P and 42P and its vicinity. Ground or power supply conductor G2 is arranged in the buildup wiring conductor 38 serving as the same layer as the pair of strip-shaped wiring conductors 42P and 42P, so as to surround the pair of strip-shaped wiring conductors 42P and 42P with a predetermined distance provided between them. Ground or power supply conductors G3 to G5 are arranged in the buildup wiring conductor 38 and the core wiring conductor 35 provided below the pair of strip-shaped wiring conductors 42P and 42P so as to be opposed to the region of the same layer as the pair of strip-shaped wiring conductors 42P and 42P, except for the connection end to the pair of external connection pads 41P and 41P, in the pair of strip-shaped wiring conductors 42P and 42P and its vicinity. An oval opening 55 is formed in the ground or power supply conductors G3 to G5 so as to surround the via holes 36 and the through holes 33 which connect the pair of strip-shaped wiring conductors 42P and 42P to the pair of external connection pads 41P and 41P, with a predetermined distance provided between them. As for the differential lines, a line width of the strip-shaped wiring conductor and a distance between the adjacent strip-shaped wiring conductors in the pair of strip-shaped wiring conductors 42P and 42P, and a distance from the ground or power supply conductor G1 to G5 are adjusted so that a characteristic impedance of the pair of strip-shaped wiring conductors 42P and 42P shows about 100Ω, for example.

According to the wiring board 200, an electrode 54 of a semiconductor element 53 is connected to the semiconductor element connection pad 40 through a solder so that the semiconductor element 53 is mounted on the wiring board 200, and the pair of external connection pads 41 and 41 is connected to a wiring conductor of an external electric circuit board through a solder. As a result, the semiconductor element 53 mounted on the wiring board 200 is electrically connected to the external electric circuit board through the wiring board 200.

The conventional wiring board 200 is designed so that the characteristic impedance in the path from the pair of semiconductor element connection pads 40P and 40P to the pair of external connection pads 41P and 41P shows a value close to 100Ω, for example. However, in the case where the capacitive component is added to the electrodes 54 of the semiconductor element 53 connected to the pair of semiconductor element connection pads 40P and 40P, there is a problem that a reflection loss or transmission loss of the high frequency signal is increased between the electrodes 54 of the semiconductor element 53 and the pair of semiconductor element connection pads 40P and 40P.

SUMMARY OF THE INVENTION

It is an object of the present invention to provide a wiring board capable of transmitting a high frequency signal at low loss in a case where a capacitive component is added to an electrode of a mounted semiconductor element.

A wiring board according to the present invention includes an insulating board formed in such a manner that an insulating layer as an inner layer is laminated under an insulating layer as a front layer, a plurality of semiconductor element connection pads including a pair of semiconductor element connection pads for a signal, formed on the insulating layer as the front layer, and a pair of strip-shaped wiring conductors formed on the insulating layer as the inner layer, having connection ends connected to the pair of semiconductor element connection pads for the signal just under the pair of pads through via holes, and having parallel extending portions extending to an outer peripheral portion from the connection ends on the insulating layer as the inner layer in parallel to each other. As for a part from the connection end to one part of the parallel extending portion in the pair of strip-shaped wiring conductors, its width is smaller than a width of a residual part, and its length is equal to or less than one-sixteenth of a wavelength of a signal transmitting in the pair of strip-shaped wiring conductors.

According to the wiring board in the present invention, as for the strip-shaped wiring conductor from the connection end connected to the semiconductor element connection pad for the signal through the via hole, to the one part of the parallel extending portion extending in parallel to each other, its length is equal to or less than one-sixteenth of the wavelength of the signal transmitting in the strip-shaped wiring conductor, and its width is smaller than the width of the residual part, so that an inductance component is increased in the part having the small width. As a result, the inductance component in this part and the capacitive component added to the electrode of the semiconductor element are offset, so that in the case where the capacitive component is added to the electrode of the mounted semiconductor element, the high frequency signal can be transmitted at low loss.

Another wiring board according to the present invention includes an insulating board formed in such a manner that an insulating layer as an inner layer is laminated under an insulating layer as a front layer, a plurality of semiconductor element connection pads including a pair of semiconductor element connection pads for a signal, formed on the insulating layer as the front layer, a pair of strip-shaped wiring conductors formed on the insulating layer as the inner layer, having connection ends connected to the pair of semiconductor element connection pads for the signal just under the pair of pads through via holes, and having parallel extending portions extending to an outer peripheral portion from the connection end on the insulating layer as the inner layer in parallel to each other, and a ground or power supply conductor arranged over the insulating layer as the front layer and under the insulating layer as the inner layer so as to vertically sandwich the pair of strip-shaped wiring conductors. An opening is provided in the ground or power supply conductor such that the ground or power supply conductor is not opposed to the pair of strip-shaped wiring conductors from the connection end to the one part of the parallel extending portion of the pair of strip-shaped wiring conductors, and has a length equal to or less than one-sixteenth of a signal transmitting in the pair of strip-shaped wiring conductors.

According to the other wiring board in the present invention, the opening is formed in the ground or power supply conductor such that the ground or power supply conductor is not opposed to the pair of strip-shaped wiring conductors, from the connection portion of the pair of strip-shaped wiring conductors connected to the semiconductor element connection pad for the signal through the via hole, to the one part of the parallel extending portion, and has the length equal to or less than one-sixteenth of the wavelength of the signal transmitting in the pair of strip-shaped wiring conductors, so that a capacitive component in the portion having the opening is reduced. As a result, the reduction of the capacitive component in this portion and the capacitive component added to the electrode of the semiconductor element are offset, so that in the case where the capacitive component is added to the electrode of the mounted semiconductor element, the high frequency signal can be transmitted at low loss.

DESCRIPTION OF THE PREFERRED EMBODIMENTS

One Embodiment of the Present Invention

Figure 1:
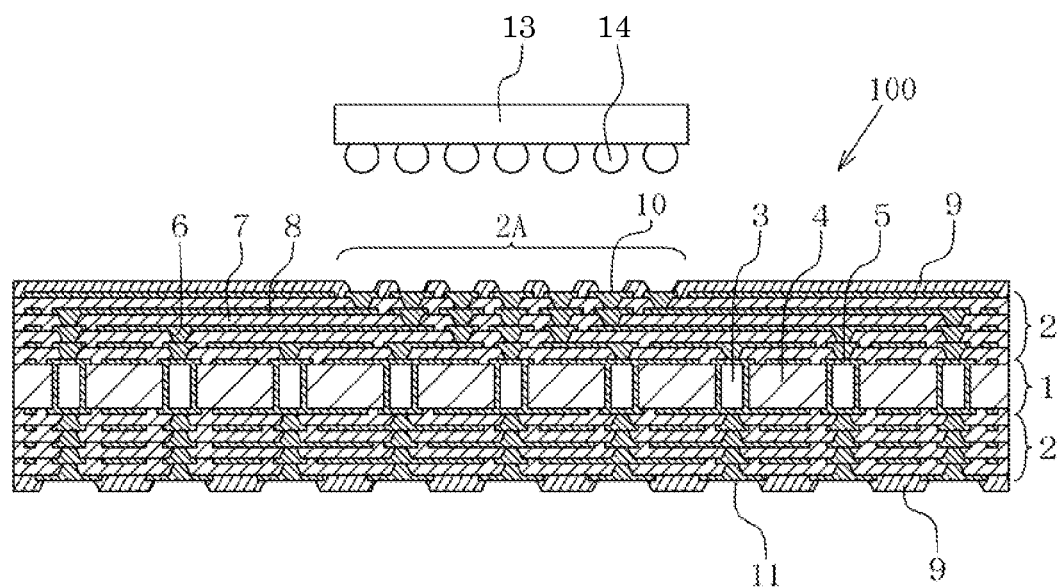
FIG. 1 is a schematic cross-sectional view showing one embodiment of a wiring board according to the present invention.

FIG. 1 is a schematic cross-sectional view showing a wiring board 100 according to this embodiment. As shown in FIG. 1, the wiring board 100 is configured such that a buildup portion 2 is laminated on each of upper and lower surfaces of a core board 1. The wiring board 100 is in a shape of a rectangular plate in which a length of one side is several tens of millimeters, and a thickness is about 250 µm to 1500 µm.

The core board 1 includes a core insulating plate 4 having a plurality of through holes 3, and core wiring conductors 5 adhered to an inside of the through hole 3 and upper and lower surfaces of the core insulating plate 4. The core insulating plate 4 is formed of, for example, a fiber-reinforced resin plate provided by impregnating glass cloth with a thermosetting resin such as epoxy resin. A thickness of the core insulating plate 4 is about 200 µm to 800 µm. A diameter of the through hole 3 is about 100 µm to 200 µm. The core wiring conductor 5 is made of copper foil or copper plating. A thickness of the core wiring conductor 5 is about 10 µm to 30 µm. In a following description, the through hole 3 means that it includes the core wiring conductor 5 adhered to its inside.

The buildup portion 2 is formed by alternately laminating a buildup insulating layer 7 (insulating board) having a plurality of via holes 6, and buildup wiring conductors 8 adhered to an inside of the via hole 6 and a surface of the buildup insulating layer 7, on each of the upper and lower surfaces of the core board 1. The buildup insulating layer 7 is formed of a filler-containing resin layer in which an inorganic insulating filler composed of silicon oxide is dispersed in a thermosetting resin such as epoxy resin. A thickness of the buildup insulating layer 7 is about 25 µm to 50 µm. A diameter of the via hole 6 is about 50 µm to 100 µm. The buildup wiring conductor 8 is made of copper plating. A thickness of the buildup wiring conductor 8 is about 10 µm to 30 µm. In the following description, the via hole 6 means that it includes the buildup wiring conductor 8 adhered to its inside.

A solder resist layer 9 is adhered to a surface of the buildup portion 2 laminated on each of the upper and lower surface of the core board 1 in order to protect an uppermost or lowermost buildup wiring conductor 8. The solder resist layer 9 is made of thermosetting resin such as acrylic-modified epoxy resin. A thickness of the solder resist layer 9 is about 20 µm to 50 µm.

A mounting portion 2A for mounting a semiconductor element 13 is provided in a center of an upper surface of the buildup portion 2 provided on an upper surface side. The mounting portion 2A is a rectangular region having a size corresponding to the semiconductor element 13. In general, each side of the mounting portion 2A is parallel to an outer peripheral side of the wiring board 100. A plurality of semiconductor element connection pads 10 each formed of the uppermost buildup wiring conductor 8 provided on the upper surface side are formed in the mounting portion 2A. A diameter of the semiconductor element connection pad 10 is about 50 µm to 150 µm. An arrangement pitch of the semiconductor element connection pads 10 is about 100 µm to 300 µm. Only the few semiconductor element connection pads 10 are shown due to drawing limitations, but in fact, several hundreds to several thousands of them are arranged in a shape of a lattice.

A plurality of external connection pads 11 each formed of a lowermost buildup wiring conductor 8 are provided on a lower surface of the buildup portion 2 provided on a lower surface side. A diameter of the external connection pad 11 is about 250 µm to 1000 µm. An arrangement pitch of the external connection pads 11 is about 500 µm to 2000 µm. Only the few external connection pads 11 are shown due to drawing limitations, but in fact, several hundreds to several thousands of them are arranged in a shape of a lattice. The semiconductor element connection pad 10 and the external connection pad 11 which correspond to each other are electrically connected to each other through the buildup wiring conductor 8 and the core wiring conductor 5.

An electrode 14 of the semiconductor element 13 is connected to the semiconductor element connection pad 10 through a solder bump, and the external connection pad 11 is connected to a wiring conductor of an external electric circuit board through a solder ball, whereby the semiconductor element 13 mounted in the mounting portion 2A and the external electric circuit board are electrically connected.

The wiring board 100 has differential lines as transmission paths for a high frequency signal. The differential lines are provided such that two transmission lines are adjacently arranged side by side with a predetermined distance provided between them. When signals having opposite phases are transmitted in these transmission lines, a transmission loss can be reduced at the time of high frequency transmission.

Figure 2:
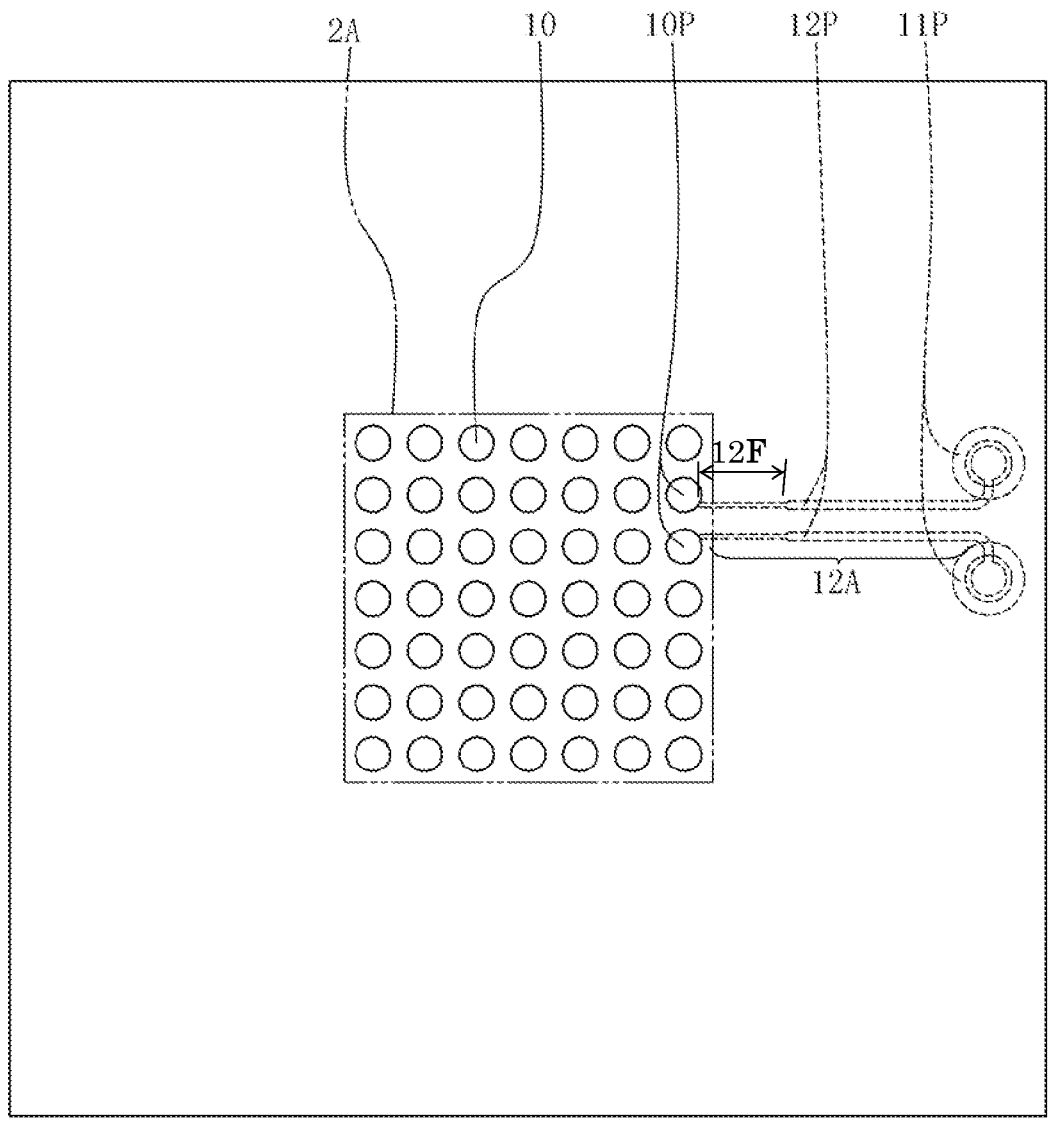
FIG. 2 is an essential part perspective top view showing the one embodiment of the wiring board according to the present invention.
Figure 3:
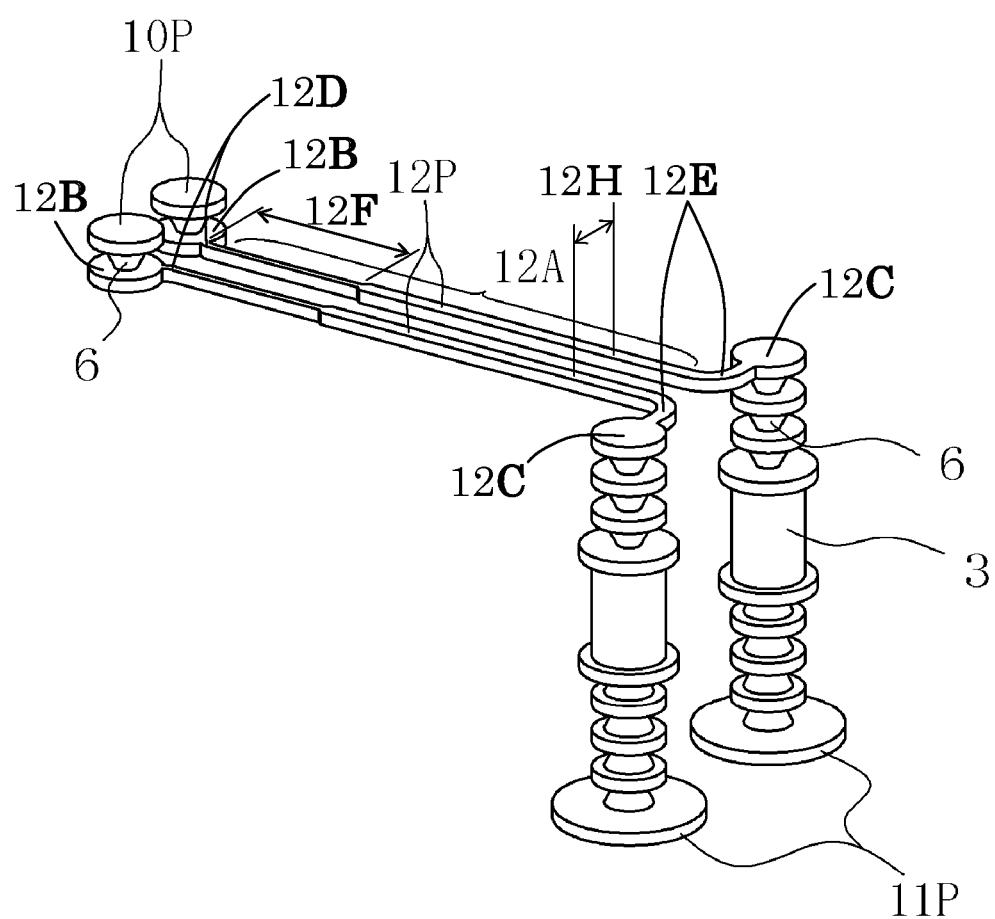
FIG. 3 is an essential part perspective view showing the one embodiment of the wiring board according to the present invention.

An example of the differential lines in the wiring board 100 will be described with reference to FIGS. 2 and 3. FIG. 2 is a top view of the wiring board 100 shown in FIG. 1, and mainly shows a couple of differential lines. Referring to FIG. 2, an outline of the wiring board 100 and the semiconductor element connection pads 10 are shown by solid lines, and a pair of strip-shaped wiring conductors 12P and 12P and a pair of external connection pads 11P and 11P composing the differential lines in the inside part and the lower surface of the wiring board 100 are shown by dotted lines. The semiconductor element mounting portion 2A is shown by a two-dot chain line. FIG. 3 is a perspective view only showing the differential lines extracted from FIG. 2. The one couple of differential lines is shown as a representative in FIGS. 2 and 3, but in fact, more couples of differential lines are arranged.

As shown in FIGS. 2 and 3, the semiconductor element connection pads 10 have a pair of connection pads 10P and 10P for the differential lines. The pair of semiconductor element connection pads 10P and 10P is adjacently arranged. The external connection pads 11 have the pair of external connection pads 11P and 11P corresponding to the pair of semiconductor element connection pads 10P and 10P, respectively. The pair of external connection pads 11P and 11P is adjacently arranged in the lower peripheral portion of the wiring board 100. The pair of semiconductor element connection pads 10P and 10P is electrically connected to the pair of external connection pads 11P and 11P, through the pair of strip-shaped wiring conductors 12P and 12P provided in the buildup wiring conductor 8 on the upper surface side.

The pair of strip-shaped wiring conductors 12P and 12P extend from first lands 12B positioned below the pair of semiconductor element connection pads 10P and 10P in the mounting portion 2A, to second lands 12C positioned above the pair of external connection pads 11P and 11P. The pair of semiconductor element connection pads 10P and 10P is electrically connected to the first lands 12B in the pair of strip-shaped wiring conductors 12P and 12P through via holes 6 positioned just under the pair of semiconductor element connection pads 10P and 10P. The pair of external connection pads 11P and 11P is electrically connected to the second lands 12C in the pair of strip-shaped wiring conductors 12P and 12P through the through hole 3 and the plurality of via holes 6 positioned above the pair of external connection pads 11P and 11P. The pair of strip-shaped wiring conductors 12P and 12P has parallel extending portions 12A extending in parallel to each other and provided such that a width of the strip-shaped wiring conductor and a distance between the strip-shaped wiring conductors are set to be predetermined lengths, except for the vicinity of connection ends to the pair of semiconductor element connection pads 10P and 10P (the first lands 12B and connection portions 12D), and the vicinity of connection ends to the pair of external connection pads 11P and 11P (the second lands 12C and connection portions 12E).

According to the present invention, as shown in FIG. 3, each of the pair of strip-shaped wiring conductors 12P and 12P has a narrow width portion 12F having a narrower width from the connection end (the connection portions 12D) connected to each of the pair of semiconductor element connection pads 10P and 10P through the via holes 6, to one part of the parallel extending portion 12A, than a width of a residual part. As for the parallel extending portion 12A except for the narrow width portion 12F, a width of the strip-shaped wiring conductor and a distance between the adjacent strip-shaped wiring conductors in the pair of strip-shaped wiring conductors 12P and 12P are adjusted so that its characteristic impedance shows about 100Ω, for example. Meanwhile, as for the narrow width portion 12F, its characteristic impedance is greater than 100Ω. Thus, the narrow width portion 12F extending from the connection end (the first lands 12B and the connection portions 12D) connected to each of the pair of semiconductor element connection pads 10P and 10P through the via holes 6 to the one part of the parallel extending portion 12A in each of the pair of strip-shaped wiring conductors 12P and 12P has the width smaller than that of the residual part, so that an inductance component in this narrow width portion 12F is increased. As a result, the inductance component of the narrow width portion 12F and a capacitive component added to the electrode 14 of the semiconductor element 13 are offset, so that in a case where the capacitive component is added to the electrode 14 of the mounted semiconductor element 13, the high frequency signal can be transmitted at low loss. In a case where the narrow width portion 12F does not include the one part of the parallel extending portion 12A in the pair of strip-shaped wiring conductors 12P and 12P, the inductance of the narrow width portion 12F cannot be sufficiently increased. When the length summed over a length of a line when straightening the curve-shaped connection portions 12D and a length of the narrow width portion 12F in the parallel extending portion 12A exceeds one-sixteenth of the wavelength of the signal transmitting in the pair of strip-shaped wiring conductors 12P and 12P, an impedance mismatch region becomes too long in the pair of strip-shaped wiring conductors 12P and 12P, for the wavelength of the signal, and reflection of the signal is increased. Therefore, the narrow width portion 12F in the pair of strip-shaped wiring conductors 12P and 12P needs to include the parallel extending portion 12A and its length needs to be one-sixteenth or less of the wavelength of the signal transmitting in the pair of strip-shaped wiring conductors 12P and 12P, preferably equal to or more than one-thirty-second and equal to or less than one-sixteenth, or more preferably equal to or more than one-thirty-second and equal to or less than one-twenty-fourth.

The width of the narrow width portion 12F is 0.2 to 0.8 times, or preferably 0.3 to 0.5 times the width of the part of the parallel extending portion 12A except for the narrow width portion 12F. The wavelength of the signal transmitting in the pair of strip-shaped wiring conductors 12P and 12P is normally 6 mm to 30 mm. Therefore, the length of the narrow width portion 12F is 0.2 mm to 1.9 mm, or preferably 0.2 mm to 1.3 mm.

Another Embodiment of the Present Invention

Figure 4:
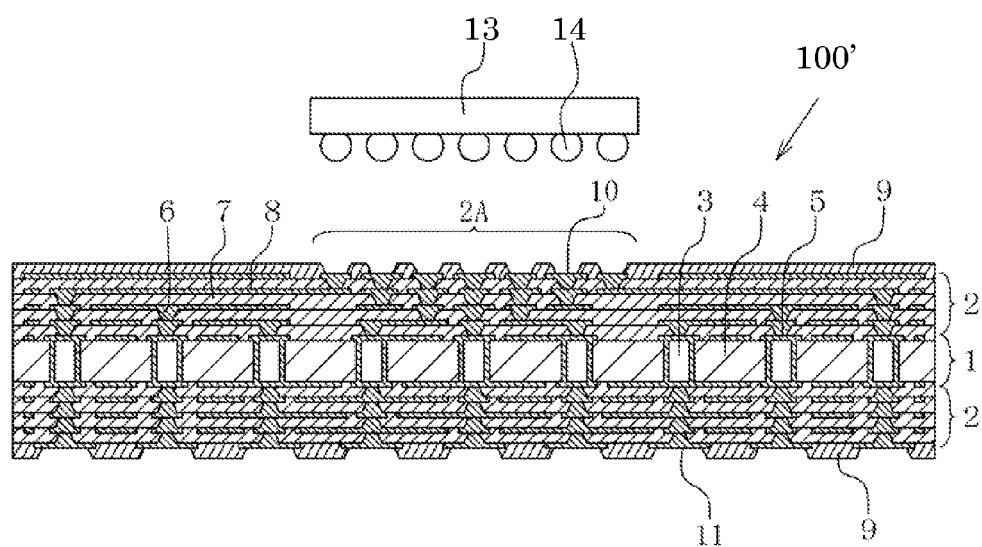
FIG. 4 is a perspective cross-sectional view showing another embodiment of a wiring board according to the present invention.
Figure 5:
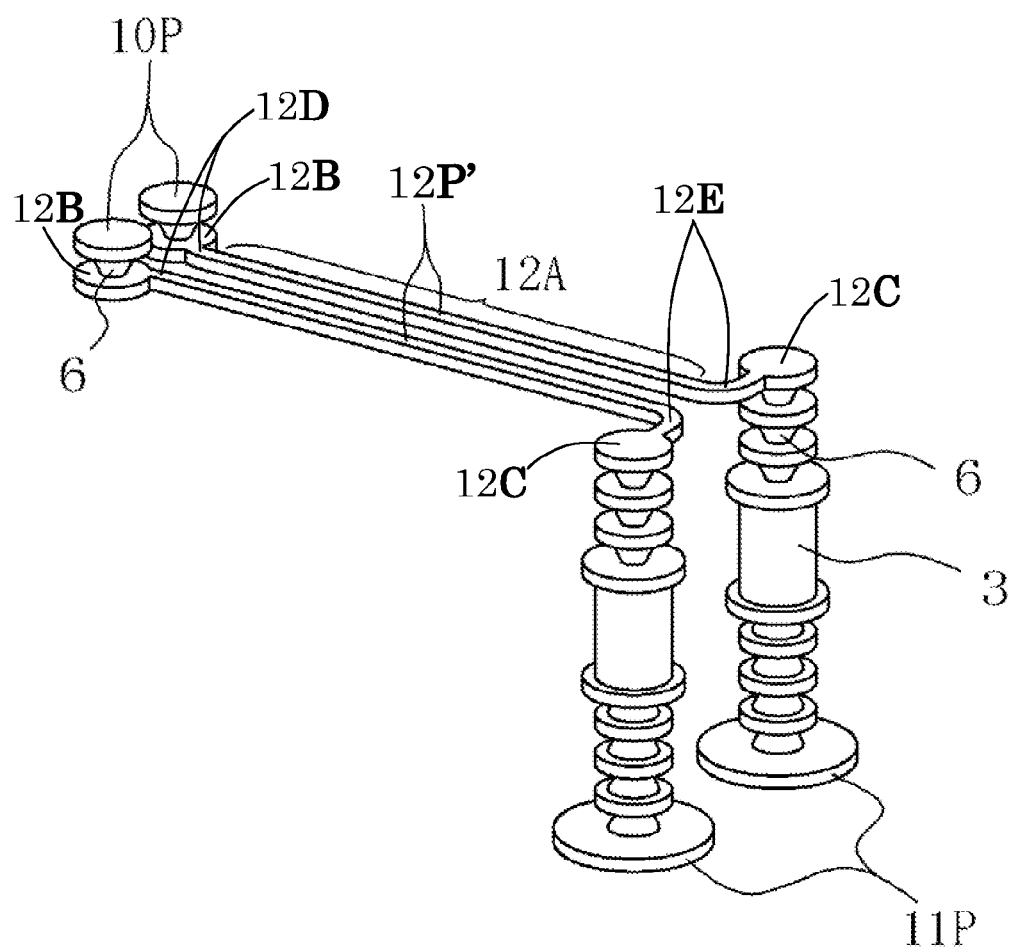
FIG. 5 is an essential part perspective view showing the other embodiment of the wiring board according to the present invention.
Figure 6:
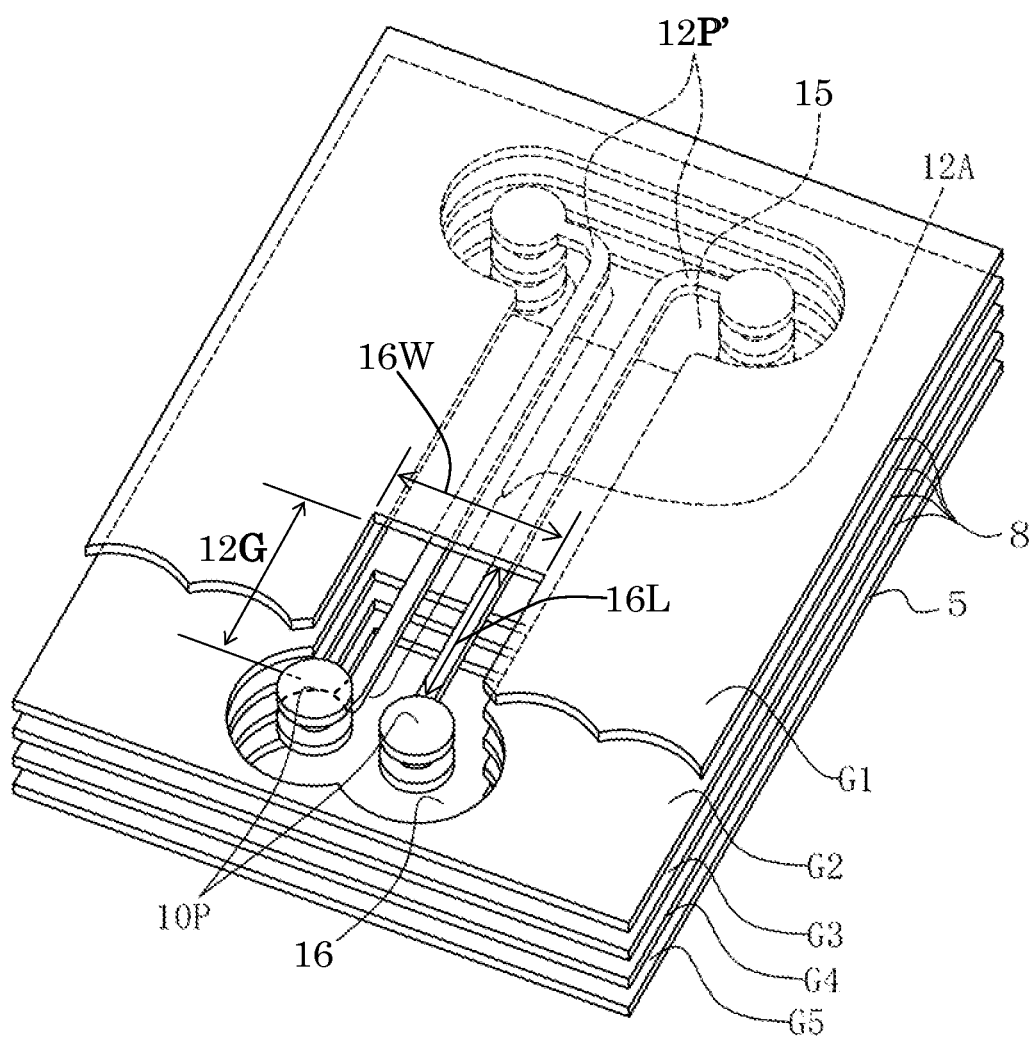
FIG. 6 is an essential part perspective view showing the other embodiment of the wiring board according to the present invention.

Next, another embodiment of the present invention will be described with reference to FIGS. 4 to 6. In FIGS. 4 to 6, the same member as the member shown in FIGS. 1 to 3 is marked with the same sign and its description is omitted.

FIG. 4 is a schematic cross-sectional view showing a wiring board 100' according to this embodiment. As shown in FIG. 5, a pair of strip-shaped wiring conductors 12P' 12' in this embodiment has a constant width from the first lands 12B to the second lands 12C.

FIG. 6 is a partial perspective view showing only an extracted part of the core wiring conductor 5 and the plurality of buildup wiring conductors 8 on the upper surface side.

A ground or power supply conductor G1 is provided in the uppermost buildup wiring conductor 8 positioned on the upper surface side of the pair of strip-shaped wiring conductors 12P' and 12P', so as to be opposed to a region of the same layer as the pair of strip-shaped wiring conductors 12P' and 12P', except for a connection end to the pair of semiconductor element connection pads 10P and 10P, in the pair of strip-shaped wiring conductors 12P' and 12P'. Ground or power supply conductor G2 is arranged in the buildup wiring conductor 8 serving as the same layer as the pair of strip-shaped wiring conductors 12P' and 12P', so as to surround the pair of strip-shaped wiring conductors 12P' and 12P' with a predetermined distance provided between them. Ground or power supply conductors G3 to G5 are arranged in the buildup wiring conductors 8 and the core wiring conductor 5 provided below the pair of strip-shaped wiring conductors 12P' and 12P' so as to be opposed to the region of the same layer as the pair of strip-shaped wiring conductors 12P' and 12P', except for the connection end to the pair of semiconductor element connection pads 10P and 10P and its vicinity, and the connection end to the pair of external connection pads 11P and 11P and its vicinity, in the pair of strip-shaped wiring conductors 12P' and 12P'. An oval opening 15 is formed in the ground or power supply conductors G3 to G5 so as to surround the via holes 6 and the through holes 3 which connect the pair of strip-shaped wiring conductors 12P' and 12P' to the pair of external connection pads 11P and 11P, with a predetermined distance provided between them. According to the present invention, an opening 16 is provided in the ground or power supply conductors G1 to G5 such that the ground or power supply conductors G1 to G5 are not opposed to the pair of strip-shaped wiring conductors 12P' and 12P', in a part from the connection ends to the pair of semiconductor element connection pads 10P and 10P (the first lands 12B) to the one parts of the parallel extending portions 12A, in the pair of strip-shaped wiring conductors 12P' and 12P'. Not being opposed to others means that they are not overlapping one above the other.

In the parallel extending portion 12A except for the portion which is not opposed to the ground or power supply conductors G1 to G5, a characteristic impedance of the pair of strip-shaped wiring conductors 12P' and 12P' is about 100Ω. Meanwhile, a characteristic impedance in a non-opposed portion 12G which is not opposed to the ground or power supply conductors G1 to G5 is greater than 100Ω. Thus, the opening 16 in which the ground or power supply conductors G1 to G5 are not opposed to the pair of strip-shaped wiring conductors 12P' and 12P' is provided in the ground or power supply conductor G1 to G5, from the connection ends (the first lands 12B) connected to the pair of semiconductor element connection pads 10P and 10P through the via holes 6, to the one parts of the parallel extending portions 12A, so that a capacitive component in the non-opposed portion 12G is reduced. As a result, the reduction of the capacitive component of the non-opposed portion 12G and the capacitive component added to the electrode 14 of the semiconductor element 13 are offset. Thus, in a case where the capacitive component is added to the electrode 14 of the semiconductor element 13, a high frequency signal can be transmitted at low loss. In a case where the non-opposed portion 12G does not include the one part of the parallel extending portion 12A, the capacitive component of the non-opposed portion 12G cannot be sufficiently reduced. When a length of the non-opposed portion 12G (a length 16L of an opening portion 16) exceeds one-sixteenth of the wavelength of the signal transmitting in the pair of strip-shaped wiring conductors 12P' and 12P', an impedance mismatching region in the pair of strip-shaped wiring conductors 12P' and 12P' becomes too long for the wavelength of the signal, and reflection of the signal is increased. Therefore, the non-opposed portion 12G needs to include the parallel extending portion 12A and its length (the length 16L of the opening portion 16) needs to be equal to or less than one-sixteenth of the wavelength of the signal transmitting in the pair of strip-shaped wiring conductors 12P' and 12P'. The wavelength of the signal transmitting in the pair of strip-shaped wiring conductors 12P' and 12P', preferably equal to or more than one-thirty-second and equal to or less than one-sixteenth, or more preferably equal to or more than one-thirty-second and equal to or less than one-twenty-forth.

The wavelength of the signal transmitting in the pair of strip-shaped wiring conductors 12P' and 12P' is normally 6 to 30 mm. Therefore, the length of the opening portion 16 L is 0.2 to 1.9 mm, or preferably 0.2 to 1.3 mm.

Still Other Embodiment of the Present Invention

Figure 7:
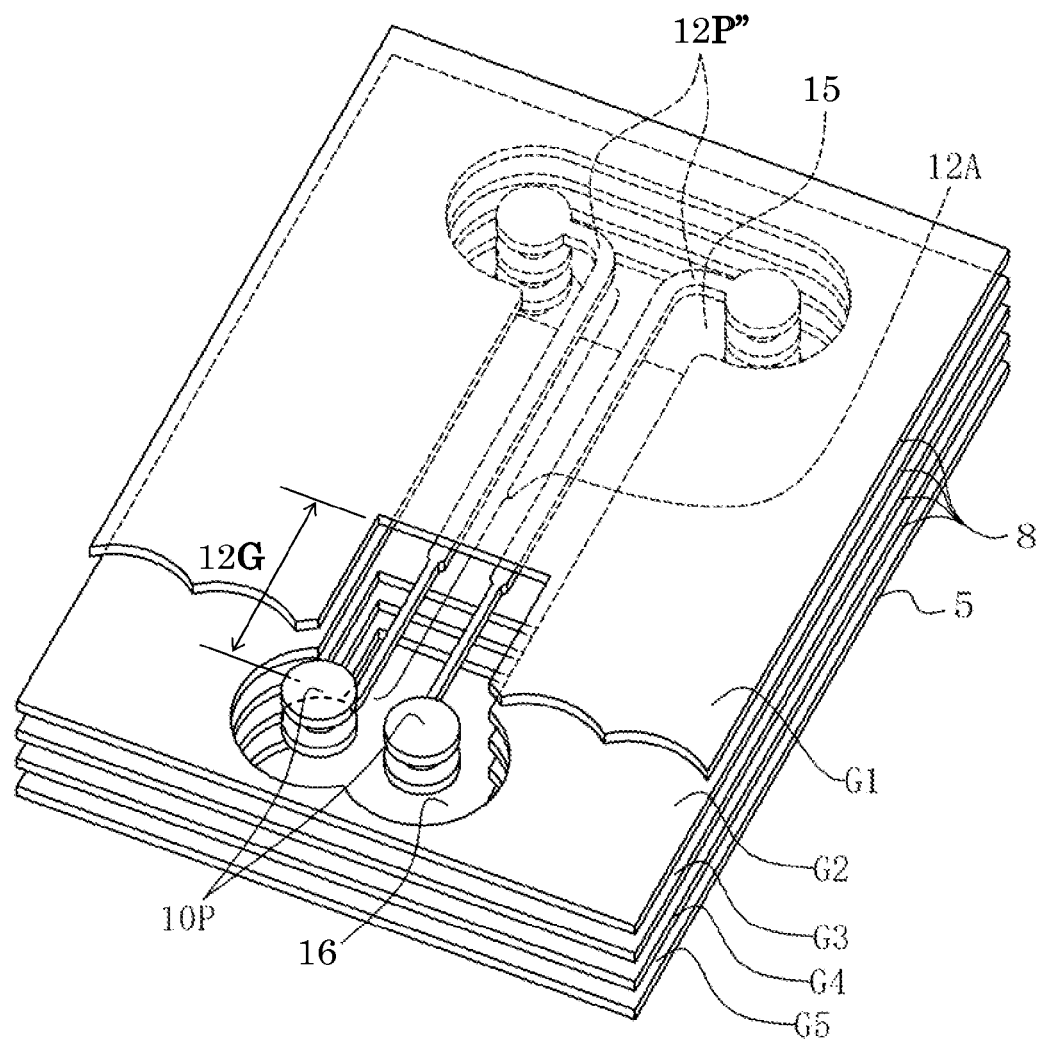
FIG. 7 is an essential part perspective view showing still another embodiment of a wiring board according to the present invention.

Next, still another embodiment of the present invention will be described with reference to FIG. 7. In FIG. 7, the same member as the member shown in FIGS. 1 to 6 is marked with the same sign and its description is omitted.

According to this embodiment, as shown in FIG. 7, a pair of strip-shaped wiring conductors 12P''' and 12P''' is provided such that a line width of the non-opposed portion 12G in the pair of strip-shaped wiring conductors 12P''' and 12P''' is smaller than a line width of a residual part. An inductance component of the pair of strip-shaped wiring conductors 12P''' and 12P''' is increased in the non-opposed portion 12G, and this increase of the inductance component in the non-opposed portion 12G and the capacitive component added to the electrode 14 of the semiconductor element 13 are further offset. Thus, in the case where the capacitive component is added to the electrode 14 of the semiconductor element 13, the high frequency signal can be transmitted at low loss. In a case where the non-opposed portion 12G in the pair of strip-shaped wiring conductors 12P''' and 12P''' does not include the one part of the parallel extending portion 12A, an inductance of the non-opposed portion 12G cannot be sufficiently increased. When a length of the non-opposed portion 12G in the pair of strip-shaped wiring conductors 12P''' and 12P''' exceeds one-sixteenth of the wavelength of the signal transmitting in the pair of strip-shaped wiring conductors 12P''' and 12P''', an impedance mismatching region in the pair of strip-shaped wiring conductors 12P''' and 12P''' becomes too long for the wavelength of the signal. Therefore, the non-opposed portion 12G in the pair of strip-shaped wiring conductors 12P''' and 12P''' needs to include the parallel extending portion 12A and its length, which is calculated by summing over a length of a line straightening the curve-shaped connection portion 12D and a length of the non-opposed portion in the parallel extending portion 12A, needs to be equal to or less than one-sixteenth of the wavelength of the signal transmitting in the pair of strip-shaped wiring conductors 12P''' and 12P'''. The wavelength of the signal transmitting in the pair of strip-shaped wiring conductors 12P''' and 12P''', preferably equal to or more than one-thirty-second and equal to or less than one-sixteenth, or more preferably equal to or more than one-thirty-second and equal to or less than one-twenty-forth.

The line width of the non-opposed portion 12G in the pair of strip-shaped wiring conductors 12P''' and 12P''' is 0.2 to 0.8 times, or preferably 0.3 to 0.5 times the width of the part of the parallel extending portion 12A except for the narrow width portion 12G. The wave length of the signal transmitting in the pair of strip-shaped wiring conductors 12P''' and 12P''' is normally 6 to 30 mm. Therefore, the length of the non-opposed portion in the pair of strip-shaped wiring conductors 12P''' and 12P''' is 0.2 to 1.9 mm, or preferably 0.2 to 1.3 mm.

The present invention is not limited to the above-described one example of the embodiments, and various changes can be made without departing from the scope of the present invention.

EXAMPLES

The inventor of the present invention created first to third analysis models according to the present invention, and first and second comparison models, and analyzed them with an electromagnetic field simulator, in order to confirm the effect of the present invention.
(First Analysis Model 100)

The first analysis model 100 was provided such that the four buildup insulating layers 7 each having a thickness of 33 μm were laminated on each of the upper and lower surfaces of the flat core insulating plate 4 having a size of 13 mm square, and a thickness of 400 μm. The pair of semiconductor element connection pads 10P and 10P for the differential lines was provided in the center of the upper surface of the uppermost buildup insulating layer 7 on the upper surface side. The pair of external connection pads 11P and 11P for the differential lines was provided in the lower surface peripheral portion of the lowermost buildup insulating layer 7 on the lower surface side. The pair of semiconductor element connection pads 10P and 10P had a diameter of 120 μm, and an arrangement pitch of 220 μm. The pair of external connection pads 11P and 11P had a diameter of 600 μm, and an arrangement pitch of 1000 μm.

The via holes 6 were provided in the uppermost buildup insulating layer 7 on the upper surface side so as to be positioned just under the pair of semiconductor element connection pads 10P and 10P. The circular first lands 12B was provided on an upper surface of the subsequently uppermost buildup insulating layer 7 to be connected to the via hole 6. The circular second lands 12C was provided on the upper surface of the same buildup insulating layer 7 so as to be positioned above the pair of external connection pads 11P and 11P. A diameter of the via hole 6 was 50 μm. A diameter of the first lands 12B and the second lands 12C was 100 μm. An arrangement pitch of the first lands 12B was set to the same pitch as the arrangement pitch of the pair of semiconductor element connection pads 10P and 10P. An arrangement pitch of the second lands 12C was set to the same pitch as the arrangement pitch of the pair of external connection pads 11P and 11P.

The pair of strip-shaped wiring conductors 12P and 12P having one end connected to the first lands 12B and the other end connected to the second lands 12C was provided on the upper surface of the above buildup insulating layer 7. The pair of strip-shaped wiring conductors 12P and 12P was provided side by side so as to have the parallel extending portions 12A extending in parallel to each other, except for its both ends. A pitch 12H of the parallel extending portions 12A of the pair of strip-shaped wiring conductors 12P and 12P was 109 μm. The connection portions 12D of the pair of strip-shaped wiring conductors 12P and 12P were provided such that its distance is increased from a position apart by 100 μm from the first lands 12B toward centers of the first lands 12B, which is equal to a length of a line straightening the curve-shaped connection portion 12D. The connection portions 12E of the pair of strip-shaped wiring conductors 12P and 12P were provided such that its distance is increased from a position apart by 900 μm from the second lands 12C, which is equal to a length of a line straightening the curve-shaped connection portion 12E, toward centers of the second lands 12C.

The through holes 3 were provided in the core insulating plate 4 so as to be positioned above the pair of external connection pads 11P and 11P. Through hole lands were provided over and under the through hole 3. A diameter of the through hole 3 was 150 μm. A diameter of the through hole land was 250 μm. An arrangement pitch of the through holes 3 was set to the same pitch as the arrangement pitch of the pair of external connection pads 11P and 11P. The through hole 3 was filled with a hole-filling resin.

The vertically laminated via holes 6 were provided between the through hole land and the second lands 12C in the buildup insulating layers 7 on the upper surface side of the core insulating plate 4, whereby the second lands 12C and the through hole land were electrically connected. Via lands were provided between the vertically laminated via holes 6. The vertically laminated via holes 6 were provided between the pair of external connection pads 11P and 11P, and the through hole lands, in the buildup insulating layers 7 on the lower surface side, whereby the pair of external connection pads 11P and 11P was connected to the corresponding through holes 3. Circular via lands were provided between the vertically laminated via holes 6. A diameter of the vertically laminated via hole 6 was 50 μm. A diameter of the via land was 100 μm. Pitches of the via holes 6 and the via lands were set to be the same as the pitch of the pair of external connection pads 11P and 11P.

A length of the pair of strip-shaped wiring conductors 12P and 12P from the first lands 12B to the second lands 12C was 11 mm. In the pair of strip-shaped wiring conductors 12P and 12P, as for apart from the connection end to the first lands 12B (the connection portions 12D) to one part of the parallel extending portion 12A, its length was 1 mm, its line width was 12 μm, and a line width of the residual part was 29 μm. As for distances between the pair of strip-shaped wiring conductors 12P and 12P in the parallel extending portion 12A, it was 97 μm in the narrow width portion 12F in the parallel extending portion 12A, and it was 80 μm in the portion except for the narrow width portion 12F in the parallel extending portion 12A. The length from the first land to the second land is a length summing over a line straightening the curve-shaped connection portion 12D, a length of the parallel extending portion 12A and a length of a line straightening the curve-shaped connection portion 12E.

A ground conductor was arranged around the pair of strip-shaped wiring conductors 12P and 12P, and the first lands 12B and the second lands 12C connected thereto in a horizontal direction, with a space of 80 μm to 90 μm provided between them. Ground conductors were also arranged above and below the pair of strip-shaped wiring conductors 12P and 12P so as to be opposed to the horizontal extending portion. It was assumed that each conductor such as the semiconductor element connection pad 10, the external connection pad 11, the strip-shaped wiring conductor, or the land had the same physical property as copper, and had a thickness of 15 µm. The electrodes 14 of the semiconductor element 13 were connected to the pair of semiconductor element connection pads 10P and 10P. It was assumed that a capacitive component of 200 fF was added to the electrodes 14 of the semiconductor element 13.

(First Comparison Model)

The first comparison model is the same as the above-described first analysis model according to the present invention except that the width of the pair of strip-shaped wiring conductors 12P and 12P was uniformly 29 µm.

Figure 8A:
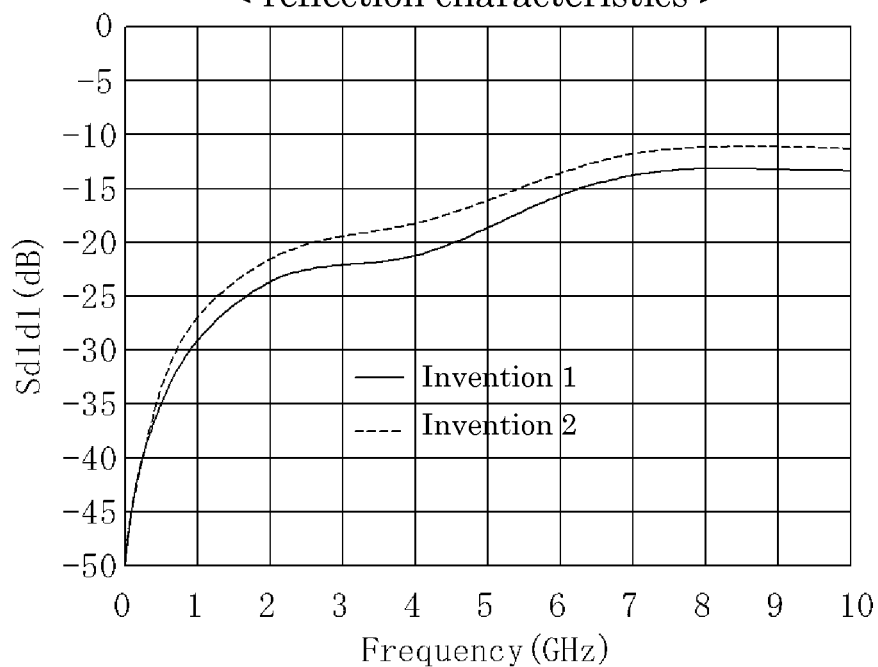
FIGS. 8(a) and 8(b) are graphs showing a simulation result to verify an effect of the present invention.
Figure 8B:
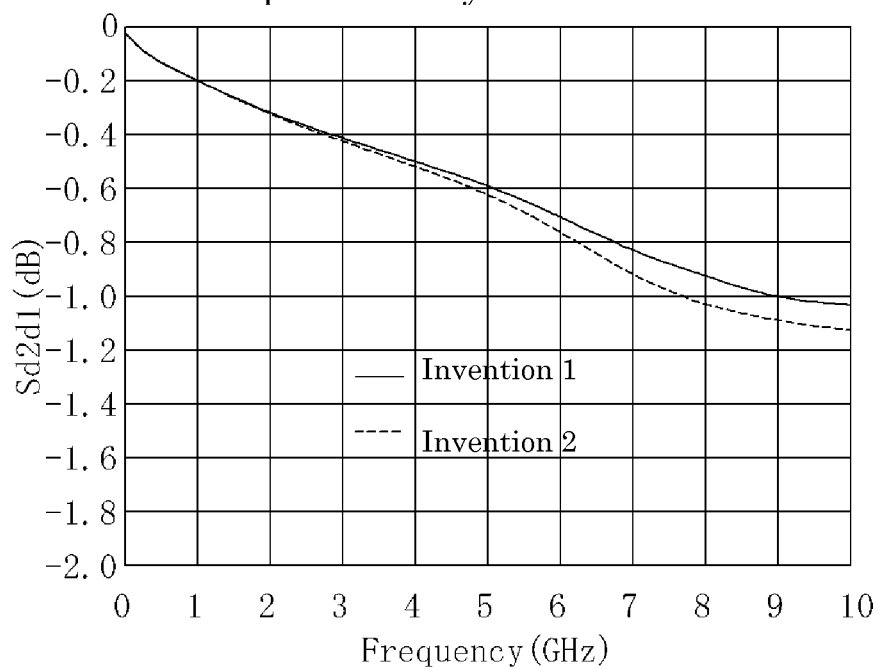

FIGS. 8(a) and 8(b) show a simulation result obtained by the electromagnetic field analysis performed for the first analysis model and the first comparison model with a HFSS produced by ANSYS Inc. As shown in FIGS. 8(a) and 8(b), the first analysis model is small in loss with respect to both reflection characteristics and permeability characteristics, compared with the first comparison model.

(Second Analysis Model) The second analysis model 100' according to the present invention is the same as the first analysis model except that the pair of strip-shaped wiring conductors, and the ground or power supply conductor are different.

That is, the pair of strip-shaped wiring conductors 12P' and 12P' had a length of 11 mm from the first lands 12B to the second lands 12C. The pair of strip-shaped wiring conductors 12P' and 12P' each had a line width of 29 µm. A distance between the pair of strip-shaped wiring conductors 12P' and 12P' in the parallel extending portion 12A was 80 µm.

A ground conductor was arranged around the pair of strip-shaped wiring conductors 12P' and 12P', and the first lands 12B and the second lands 12C connected thereto in a horizontal direction, with a space of 80 µm to 90 µm provided between them. Ground conductors were also arranged on the surface of the buildup insulating layer 7 and on the surface of the core insulating plate 4 positioned above and below the pair of strip-shaped wiring conductors 12P' and 12P' so as to be opposed to the pair of strip-shaped wiring conductors 12P' and 12P'. The first opening 16 having a width 16W of 298 µm and a length 16L of 1 mm was provided in the ground conductors on the upper surface side of the core insulating plate 4 so that the ground conductors were not opposed to the pair of strip-shaped wiring conductors 12P' and 12P' from the first lands 12B along the pair of strip-shaped wiring conductors 12P' and 12P'. The oval second opening 15 was formed in the ground conductors except for the uppermost layer so as to surround the via land, the through hole land, and the pair of external connection pads 11P and 11P which are connected to the second lands 12C. The second opening 15 was formed by connecting two circles each of which is concentric with the via land, the through hole land, and the pair of external connection pads 11. A diameter of the concentric circle for forming the second opening 15 on the upper surface side of the core insulating plate 4 was 550 µm. A diameter of the concentric circle for forming the second opening 15 on the lower surface side of the core insulating plate 4 was 800 µm. It was assumed that each conductor such as the semiconductor element connection pad 10, the external connection pad 11, the strip-shaped wiring conductor, or the land had the same physical property as copper, and had a thickness of 15 µm. The electrodes 14 of the semiconductor element 13 were connected to the pair of semiconductor element connection pads 10P and 10P. It was assumed that a capacitive component of 200 fF was added to the electrodes 14 of the semiconductor element 13.

(Third Analysis Model)

A third analysis model 100" according to the present invention is the same as the second analysis model except that the pair of strip-shaped wiring conductors is different.

That is, as for the part from the connection end to the first lands 12B (the connection portions 12D) to one part of the parallel extending portion 12A in the pair of strip-shaped wiring conductors 12P''' and 12P''', its length was 1 mm, its line width was 12 µm, and a line width of the residual portion was 29 µm. The pair of strip-shaped wiring conductors 12P''' and 12P''' in the parallel extending portion 12A was the same as the pair of strip-shaped wiring conductors 12P' and 12P' in the above second analysis model 100' except that its distance was 97 µm in the narrow width portion 12F in the parallel extending portion 12A and it was 80 µm in the portion except the narrow width portion 12F in the parallel extending portion 12A.

(Second Comparison Model)

The second comparison analysis model was the same as the second analysis model 100' except for having no first opening 16 which was formed in the ground conductors on the upper surface side of the core insulating plate 4 so that the ground conductors were not opposed to the pair of strip-shaped wiring conductors from the first lands 12B along the pair of strip-shaped wiring conductors.

Figure 9A:
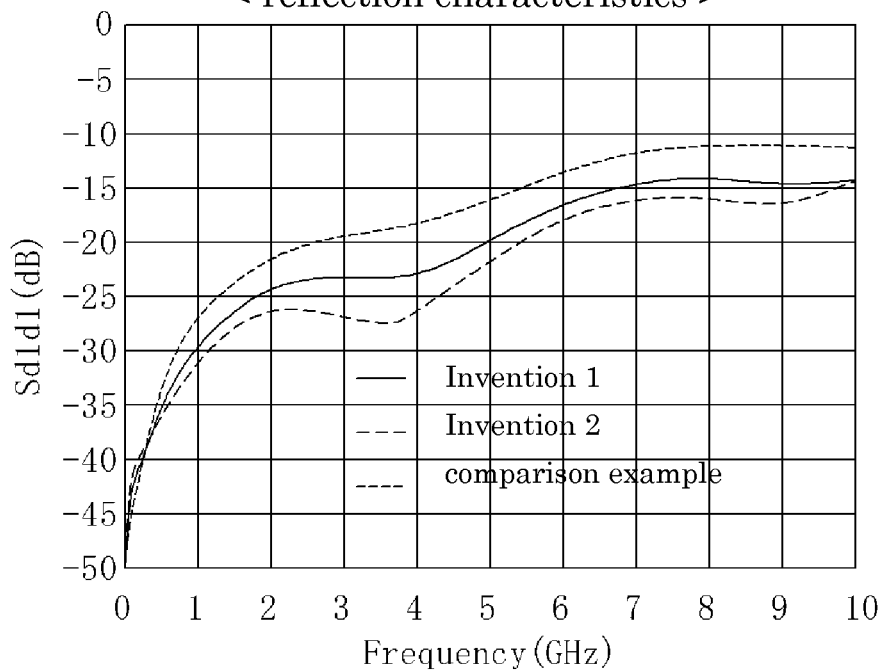
FIGS. 9(a) and 9(b) are graphs showing a simulation result to verify the effect of the present invention.
Figure 9B:
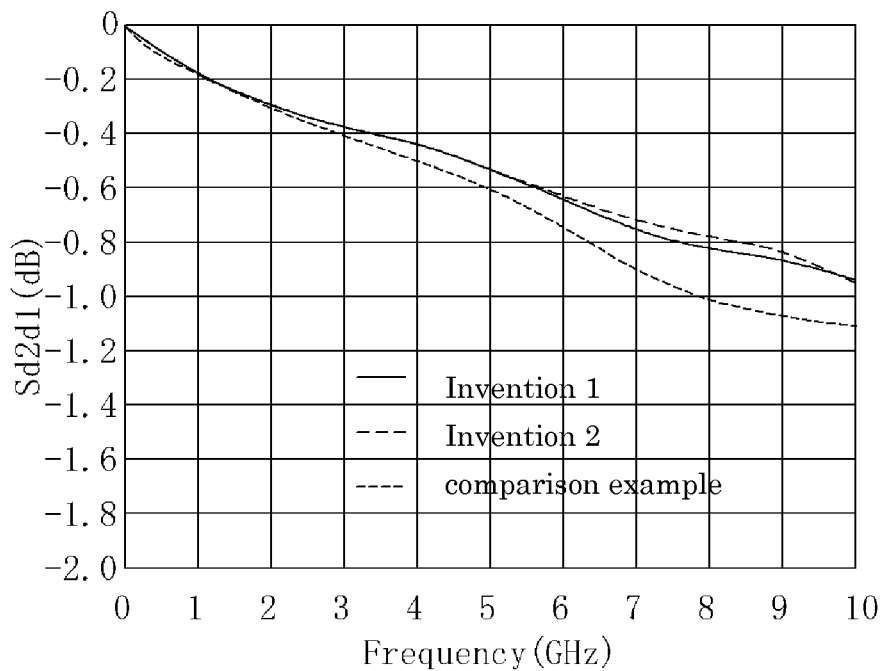
Figure 10:
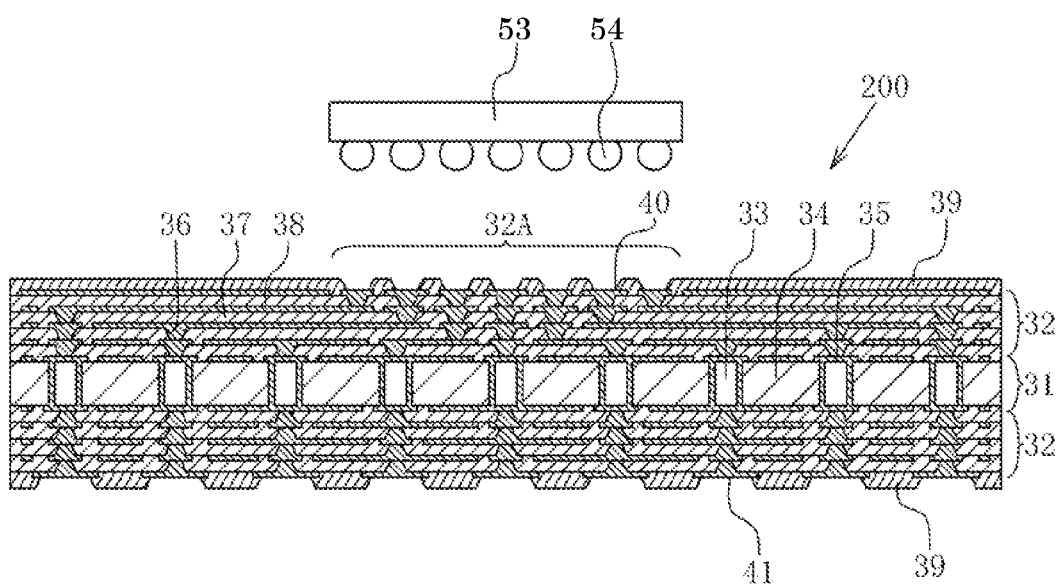
FIG. 10 is a schematic cross-sectional view showing a conventional wiring board.
Figure 11:
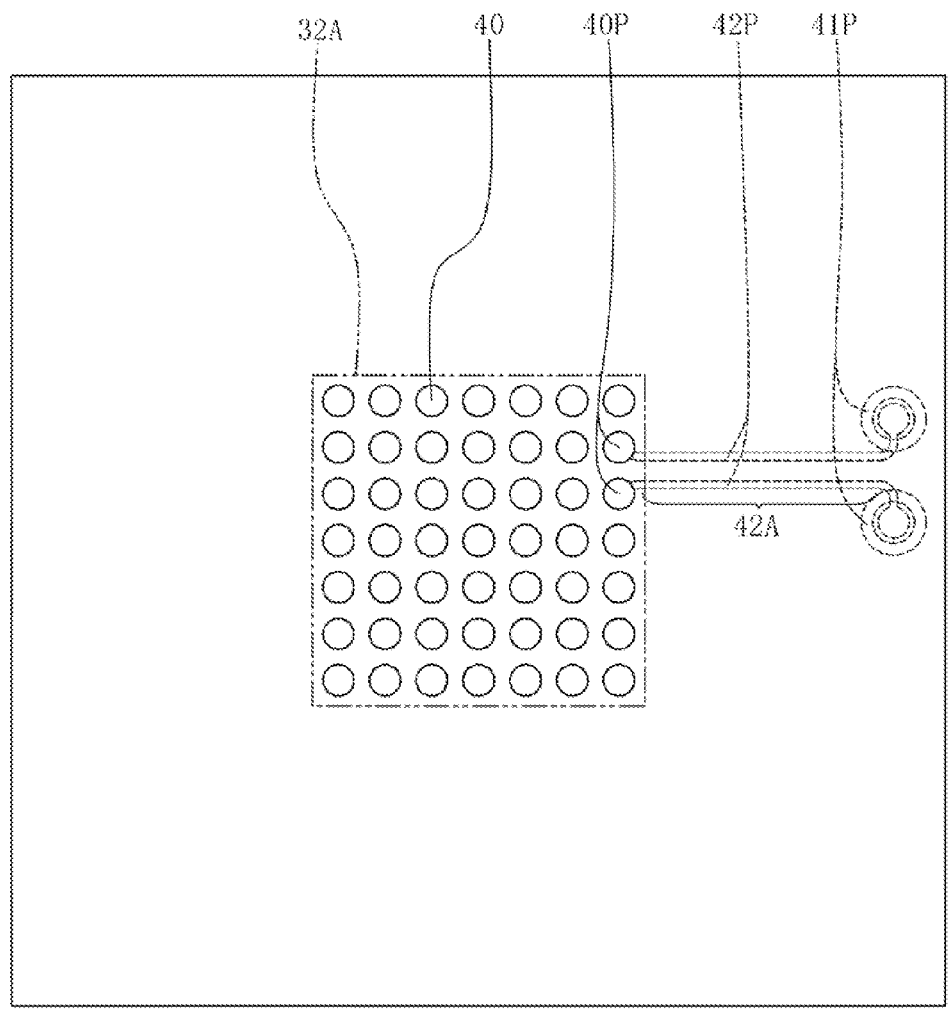
FIG. 11 is an essential part perspective top view showing the conventional wiring board.
Figure 12:
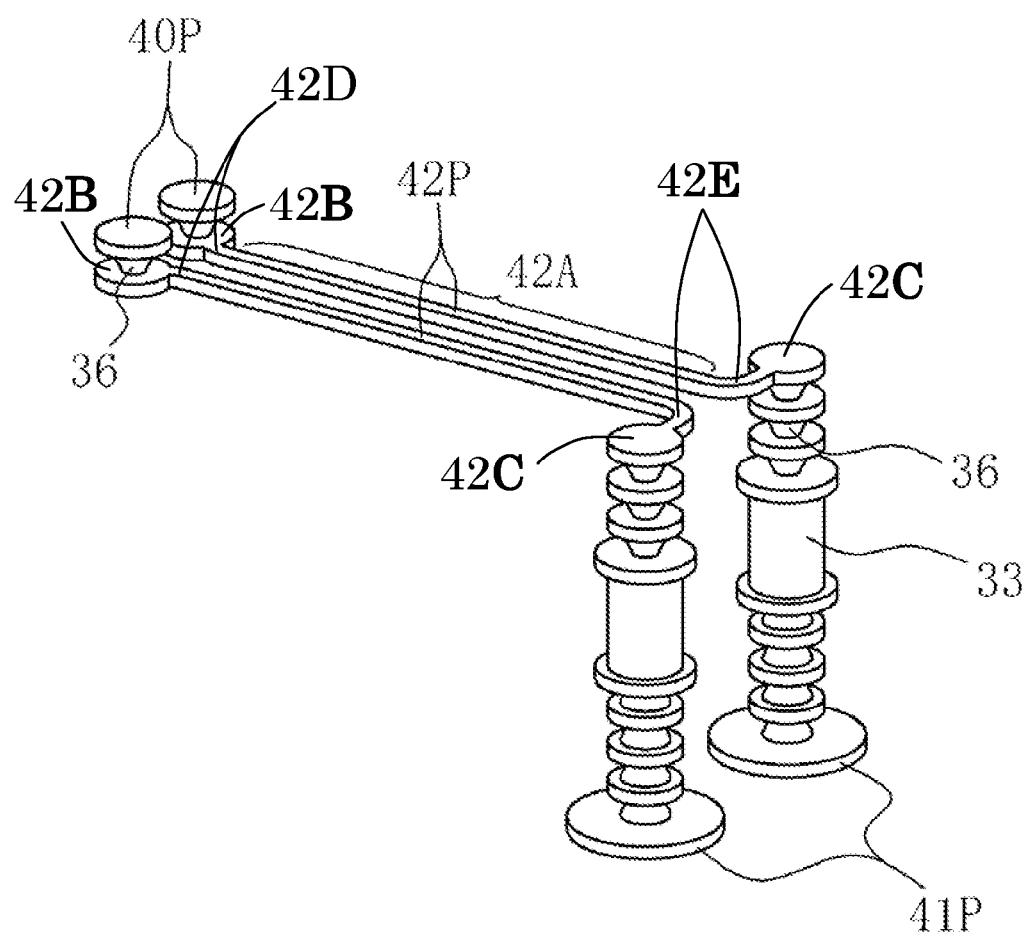
FIG. 12 is an essential part perspective view showing the conventional wiring board.
Figure 13:
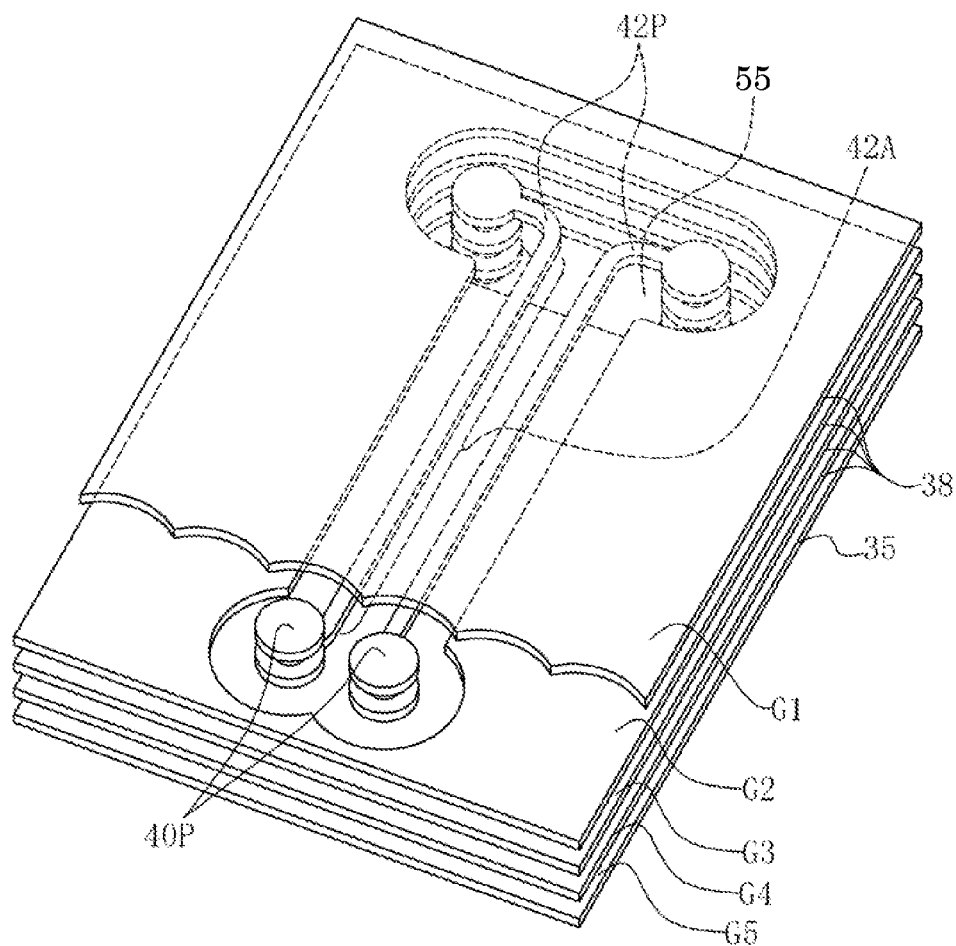
FIG. 13 is an essential part perspective view showing the conventional wiring board.

FIGS. 9(a) and 9(b) show a simulation result obtained by the electromagnetic field analysis performed for the above analysis models with the HFSS produced by ANSYS Inc. As shown in FIGS. 9(a) and 9(b), the second analysis model 100' and the third analysis model 100" are small in loss with respect to both reflection characteristics and permeability characteristics, compared with the second comparison model. In addition, it is found that the third analysis model 100" is smaller in loss with respect to both reflection characteristics and permeability characteristics, than the second analysis model 100'.

What is claimed is:

1. A wiring board comprising:
   an insulating board formed in such a manner that an insulating layer as an inner layer is laminated under an insulating layer as a front layer;
   a plurality of semiconductor element connection pads including a pair of semiconductor element connection pads for a signal, formed on the insulating layer as the front layer; and
   a pair of strip-shaped wiring conductors formed on the insulating layer as the inner layer, having connection ends connected to the pair of semiconductor element connection pads for the signal just under the pair of pads through via holes, and having parallel extending portions extending to an outer peripheral portion from the connection ends on the insulating layer as the inner layer in parallel to each other,
   wherein as for a part from the connection ends to one part of the parallel extending portions in the pair of strip-shaped wiring conductors, each width of the pair of strip-shaped wiring conductors is smaller than a width of a residual part, and each length of a narrow width portion of the pair of strip-shaped wiring conductors is equal to or less than one-sixteenth and equal or more than one-thirty-second of a wavelength of a signal transmitting in the pair of strip-shaped wiring conductors.

2. The wiring board according to claim 1, wherein the connection ends are circular lands.

3. The wiring board according to claim 1, wherein the width from the connection ends to the one part of the parallel extending portions is 0.2 to 0.8 times the width of the residual part in the parallel extending portions.

4. The wiring board according to claim 1, wherein the length from the connection ends to the one part of the parallel extending portions is 0.2 mm to 1.9 mm.

5. The wiring board according to claim 1, wherein the wavelength of the signal transmitting in the pair of strip-shaped wiring conductors is 6 mm to 30 mm.

6. A wiring board comprising:
- an insulating board formed in such a manner that an insulating layer as an inner layer is laminated under an insulating layer as a front layer;
- a plurality of semiconductor element connection pads including a pair of semiconductor element connection pads for a signal, formed on the insulating layer as the front layer;
- a pair of strip-shaped wiring conductors formed on the insulating layer as the inner layer, having connection ends connected to the pair of semiconductor element connection pads for the signal just under the pair of pads through via holes, and having parallel extending portions extending to an outer peripheral portion from the connection ends on the insulating layer as the inner layer in parallel to each other; and
- a ground or power supply conductor arranged over the insulating layer as the front layer and under the insulating layer as the inner layer so as to vertically sandwich the pair of strip-shaped wiring conductors,
- wherein an opening is provided in the ground or power supply conductor such that the ground or power supply conductor is not opposed to the pair of strip-shaped wiring conductors from the connection ends to the one part of the parallel extending portions of the pair of strip-shaped wiring conductors, and the opening extends along the parallel extending portions so as to have a length equal to or less than one-sixteenth and equal or more than one-thirty-second of a wavelength of a signal transmitting in the pair of strip-shaped wiring conductors.

7. The wiring board according to claim 6, wherein the connection ends are circular lands.

8. The wiring board according to claim 6, wherein a length from the connection ends to the one part of the parallel extending portions of the pair of strip-shaped wiring conductors is 0.2 mm to 1.9 mm.

9. The wiring board according to claim 6, wherein the wavelength of the signal transmitting in the pair of strip-shaped wiring conductors is 6 mm to 30 mm.

10. The wiring board according to claim 6, wherein as for the part from the connection ends to the one part of the parallel extending portions in the pair of strip-shaped wiring conductors, its width is smaller than a width of a residual part, and its length is equal to or less than one-sixteenth of the wavelength of the signal transmitting in the pair of strip-shaped wiring conductors.

11. The wiring board according to claim 10, wherein the connection ends are circular lands.

12. The wiring board according to claim 10, wherein the width from the connection ends to the one part of the parallel extending portions is 0.2 to 0.8 times the width of the residual part in the parallel extending portions.

13. The wiring board according to claim 10, wherein the length from the connection ends to the one part of the parallel extending portions is 0.2 mm to 1.9 mm.

14. The wiring board according to claim 10, wherein the wavelength of the signal transmitting in the pair of strip-shaped wiring conductors is 6 mm to 30 mm.

\* \* \* \* \*